United States Patent
Kojima et al.

(10) Patent No.: US 12,260,339 B2
(45) Date of Patent: Mar. 25, 2025

(54) GENERATIVE MODEL FOR INVERSE DESIGN OF MATERIALS, DEVICES, AND STRUCTURES

(71) Applicant: Mitsubishi Electric Research Laboratories, Inc., Cambridge, MA (US)

(72) Inventors: Keisuke Kojima, Weston, MA (US); Toshiaki Koike Akino, Belmont, MA (US); Yingheng Tang, West Lafayette, IN (US); Ye Wang, Andover, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 997 days.

(21) Appl. No.: 17/306,003

(22) Filed: May 3, 2021

(65) Prior Publication Data
US 2022/0358368 A1 Nov. 10, 2022

(51) Int. Cl.
*G06N 3/088* (2023.01)
*G06N 3/045* (2023.01)

(52) U.S. Cl.
CPC ............ *G06N 3/088* (2013.01); *G06N 3/045* (2023.01)

(58) Field of Classification Search
CPC ................................ G06N 3/088; G06N 3/045
See application file for complete search history.

(56) References Cited

U.S. PATENT DOCUMENTS

| | | | |
|---|---|---|---|
| 2020/0065635 A1* | 2/2020 | Lim | G06N 3/084 |
| 2021/0049452 A1* | 2/2021 | Fan | G06N 3/049 |
| 2023/0326542 A1* | 10/2023 | Montserrat | G16B 40/00 |
| | | | 703/11 |

FOREIGN PATENT DOCUMENTS

WO WO-2021052712 A1 * 3/2021 ............... G03F 1/36

OTHER PUBLICATIONS

Tahersima et al. "Deep Neural Network Inverse Design of Integrated Nanophotonic Devices", 2018, pp. 8, 1809.03555 (arxiv.org).*
Russo et al. "From source to target and back: Symmetric Bi-Directional Adaptive GAN", IEEE CVPR, 2018, Pp. 8099-8108.*
Tang et al. Generative Deep Learning Modl for Multi level Nano optic Broadband Power Splitter. arxiv.org, Cornell University, Ithaca NY 14853, Mar. 8, 2020.

(Continued)

*Primary Examiner* — Li Wu Chang
(74) *Attorney, Agent, or Firm* — Gene Vinokur

(57) ABSTRACT

A photonic device for splitting optical beams includes an input port configured to receive an input beam having an input power, a power splitter including perturbation segments arranged in a first region and a second region of a guide material having a first refractive index, each segment having a second refractive index, wherein the first region is configured to split the input beam into a first beam and a second beam, wherein and the second region is configured to separately guide the first and second beams, wherein the first refractive index is greater than the second refractive index, and output ports including first and second output ports connected the power splitter to respectively receive and transmit the first and second beams.

20 Claims, 17 Drawing Sheets

(56) References Cited

OTHER PUBLICATIONS

Jha et al. Disentangling Factors of Variation with Cycle Consistent Variational Auto Encoders, Oct. 7, 2018. Advances in Biometrics, International Conference, ICB 2007, Seoul, Korea, Aug. 27-29, 2007. Proceedings and lecture notes. p. 829-845.

Kojima et al. Deep Neural Networks for Inverse Design of Nanophotonic Devices, Journal of Lightwave Technology, IEEE, USA, vol. 39, No. 4, Jan. 8, 2021. pp 1010-1019.

Takaaki et al. Cycle consistency training for end to end speech recognition, ICASSP 2019, IEEE Conference on Acoustics, Speech and signal processing, IEEE May 12, 2019. pp 6271-6275.

Jun Yan et al., Unpaired Image to Image Translation using Cycle Consistent Adversarial Networks, ARXIV.org. Cornell University Library, Ithaca, NY Mar. 30, 2017.

* cited by examiner

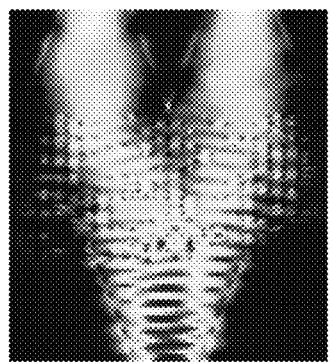
FIG. 12b
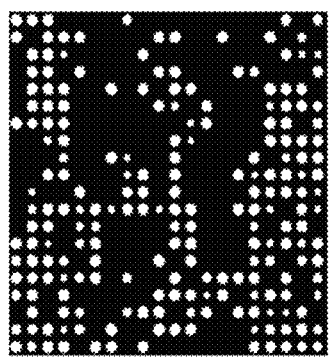
FIG. 12a
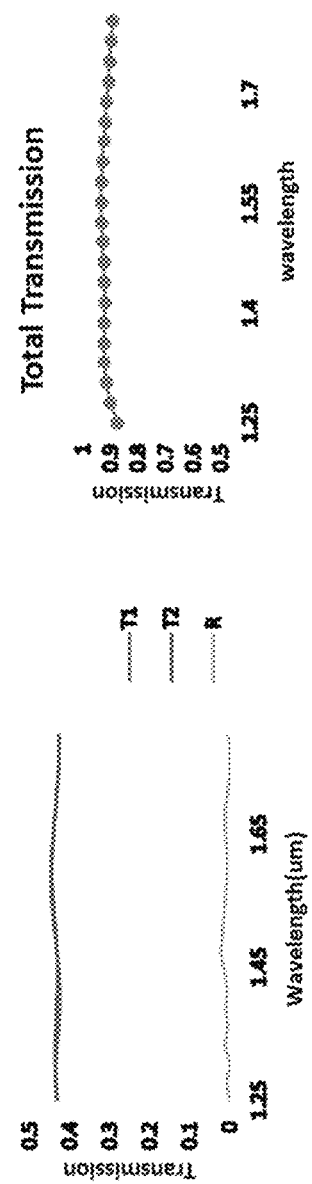
FIG. 12d
FIG. 12c

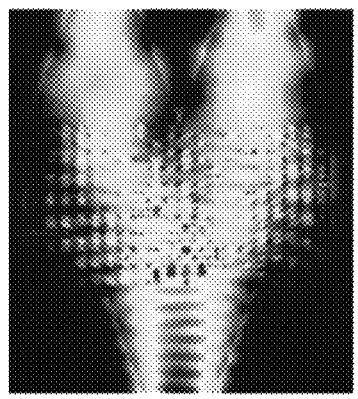
FIG. 13b
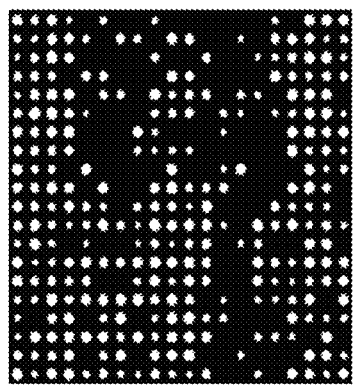
FIG. 13a
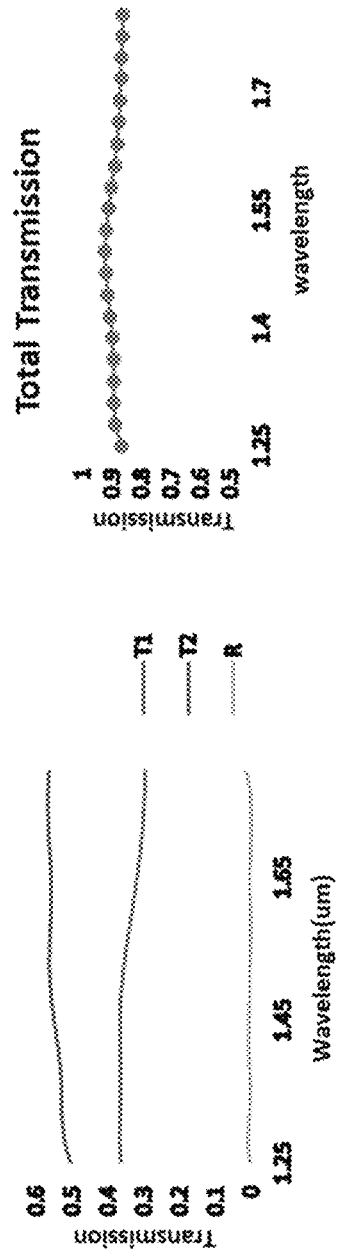
FIG. 13d
FIG. 13c

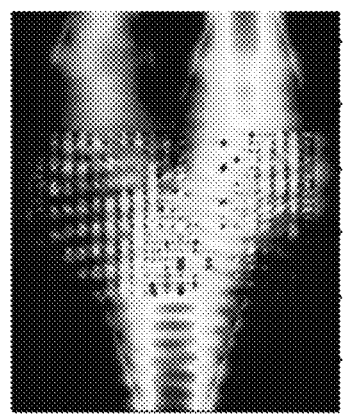
FIG. 15b
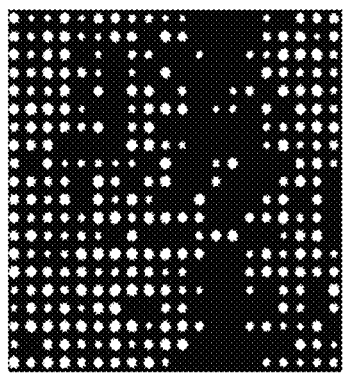
FIG. 15a
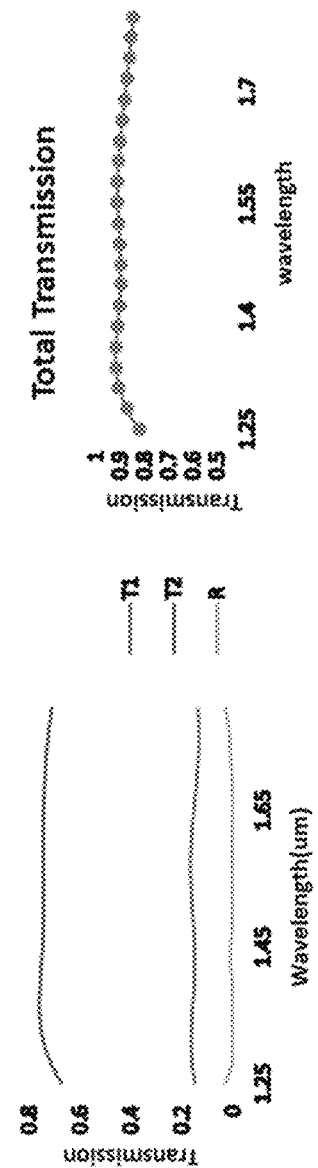
FIG. 15d
FIG. 15c

GENERATIVE MODEL FOR INVERSE DESIGN OF MATERIALS, DEVICES, AND STRUCTURES

FIELD OF THE INVENTION

The invention generally related to method and system for training a device design network for use conditional variational autoencoder to randomly generate materials, device, or structural designs.

BACKGROUND OF THE INVENTION

In many areas of materials, devices, and structures, designing is a challenge because tens, hundreds, or even more parameters need to be optimized simultaneously, and each simulation or experiment to verify the updated characteristics for new parameter sets takes a long time. So efficient optimization methods are desired.

Inverse design of optical devices using deep neural network for regression in forward or inverse directions have been done before. (Tahersima et al., Scientific Reports). Once the inverse model is fully trained, it can theoretically generate the design parameters for us. However, the previous inverse neural network model is for optimizing the binary structure (such as 0 or 1), which reduce the dimension of the actual optimization problem. This may bring up some limitations such as narrower bandwidth and semi optimized result which requires to be further optimized. There is a need to construct a better generative model to be used for more sophisticated optimization problems.

SUMMARY OF THE INVENTION

The invention proposes to use a conditional variational autoencoder, combined with an adversary network to randomly generate device designs wherein desired device performances are given as conditions. Active training (co-training) can be added for further improving the performance.

Some embodiments of the present disclosure are the silicon photonics splitters based on a rectangular or square structure with periodic holes. The dimension of the final square is 2.25 μm by 2.25 μm. There are 400 holes over the square, and these holes have variable hole diameter ranging from 40 μm to 90 μm. The fully trained conditional Variational Autoencoder (CVAE) model can generate different hole vectors combinations based on different splitting ratio inputs. The overall transmission efficiency for all the generated devices is around 90% across a very broad bandwidth (from 1300 nm to 1800 nm), with negligible insertion loss (below −25 dB). Such model can be applied to different devices such as wavelength splitter, mode converter, directional coupler etc.

Some of the embodiments are based on the training data combined with two different datasets: first is the "semi-optimized" results with binary hole size (either no hole or 90 nm hole). The bandwidth for these devices is relatively low (100 nm). The second part of the dataset is combination of multiple patterns along with its performances. According to embodiments, it is shown that with the above "semi-optimized" results, we can train model which is capable of generating devices with excellent performance (90% total transmission) over a broad bandwidth (500 nm). In according to some embodiments of the present disclosure, the model structure is a Conditional Variational Auto Encoder along with the adversarial block, which is based on Bayesian Theorem. It wants the model to underlie the probability distribution of data so that it could sample new data from that distribution. Our training data are generated by doing FDTD simulations. The data are constructed by the following: several DBS simulations and some random generated patterns. The training patterns are all binary holes and the bandwidth is relatively small (1500-1600 nm). The total training data is ~15,000.

According to some embodiments of the present invention, a system for training a device design network for generating a layout of a device is provided. The system may include an interface configured to acquire input data of a device; a memory to store the device design network including first and second encoders, first and second decoders, and first and second adversarial blocks; and a processor, in connection with the memory, configured to: update the first and second encoders and the first and second decoders based on a first loss function and a third loss function to reduce a difference between the input data and output data of the first and second decoders; and update the first and second adversarial blocks by maximizing a second loss function.

Further, some embodiments of the present invention can provide a computer-implemented training method for training a device design network. In this case, the method comprising steps of: acquire input data of a device via an interface; update first and second encoders and first and second decoders based on a first loss function and a third loss function to reduce a difference between the input data and output data of the first and second decoders; and update first and second adversarial blocks by maximizing a second loss function.

Yet further, some embodiments of the present invention are based on recognition that a computer-implemented method can be provided for generating a layout of a device using a device generating network. The computer-implemented method may include steps of acquiring input data of the device via an interface; feeding the input data into the device generating network, wherein the device generating network is pretrained by a computer-implemented training method, wherein the computer-implemented training method is configured to acquire input data of a device via an interface; update first and second encoders and first and second decoders based on a first loss function and a third loss function to reduce a difference between the input data and output data of the first and second decoders; and update first and second adversarial blocks by maximizing a second loss function. The computer-implemented method further includes generating layout data of the layout of the device using the pretrained device generating network and storing the layout data into a memory.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

FIG. 12a shows the generated device with the splitting ratio of 5:5, according to embodiments of the present invention;

FIG. 12b shows the simulation result for the generated 5:5 splitter, according to embodiments of the present invention;

FIG. 12c shows the simulation result for the generated 5:5 splitter, according to embodiments of the present invention;

FIG. 12d shows the simulation result for the generated 5:5 splitter, according to embodiments of the present invention;

FIG. 13a shows the generated device with the splitting ratio of 6:4, according to embodiments of the present invention;

FIG. 13b shows the simulation result for the generated 6:4 splitter, according to embodiments of the present invention;

FIG. 13c shows the simulation result for the generated 5:5 splitter, according to embodiments of the present invention;

FIG. 13d shows the simulation result for the generated 5:5 splitter, according to embodiments of the present invention;

FIG. 15a shows the generated device with the splitting ratio of 8:2, according to embodiments of the present invention;

FIG. 15b shows the simulation result for the generated 8:2 splitter, according to embodiments of the present invention;

FIG. 15c shows the simulation result for the generated 5:5 splitter, according to embodiments of the present invention;

FIG. 15d shows the simulation result for the generated 5:5 splitter, according to embodiments of the present invention;

DETAILED DESCRIPTION OF THE PREFERRED EMBODIMENTS

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Figure 1:
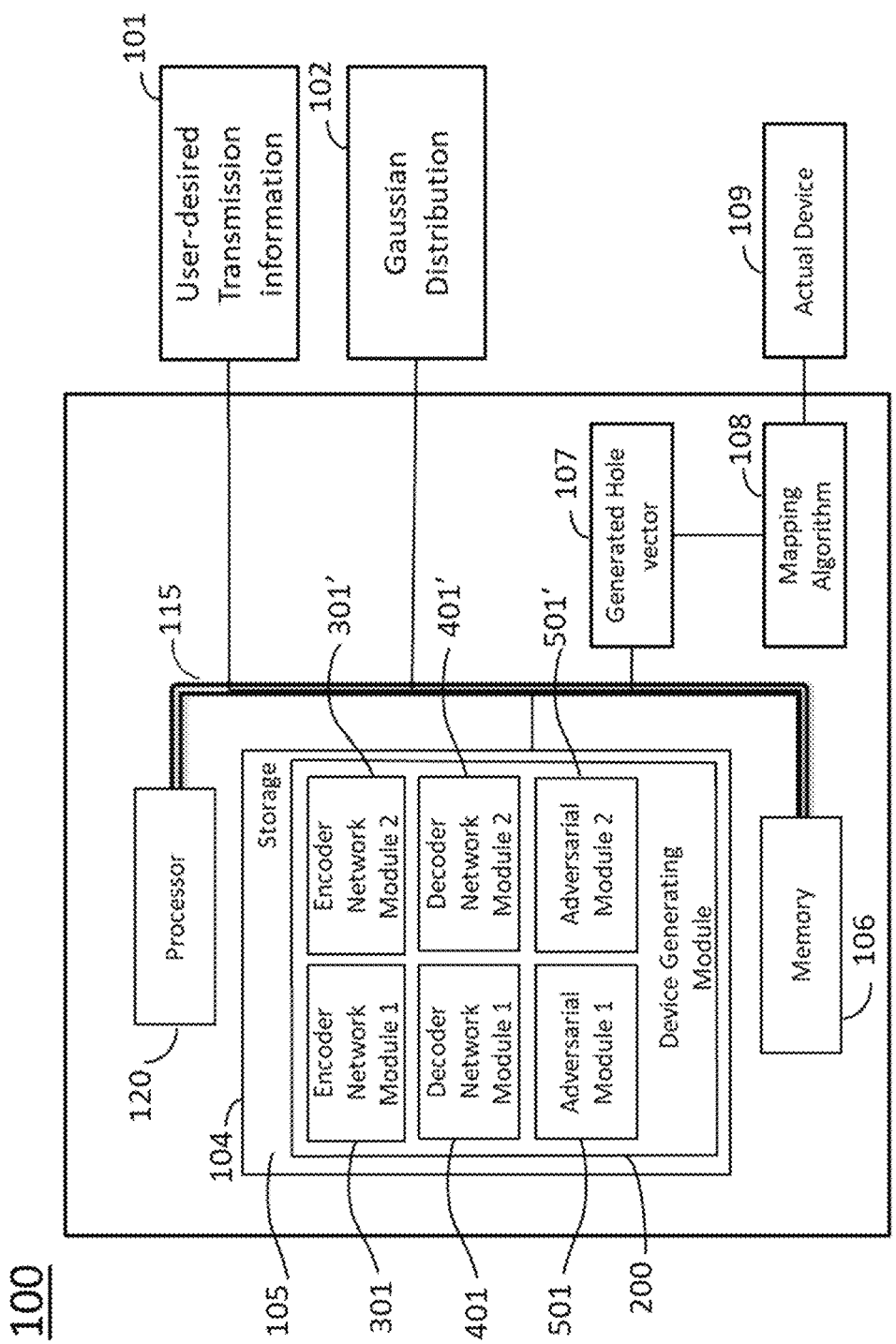
FIG. 1 shows the overall configuration of system, according to embodiments of the present invention.

FIG. 1 is the general structure of the system 100 including a neural network modules trained to provide a layout of a device, according to some embodiments of the present invention. The system 100 includes an interface 115, a processor 120, a storage 104, a memory 106. The storage 104 includes a device generating module 200 that includes encoder network modules 301 and 301', decoder network modules 401 and 401' and adversarial module (blocks) 501 and 501'. The storage 104 may include a mapping algorithm 108 configured to generate a layout of an actual device 109, or the mapping algorithm 108 may be stored into another memory (not shown). The interface 115 is configured to communicate between the memory 106, the storage 104, the processor 120 and the mapping algorithm 108. The interface 115 is also configured to receive input data including a user-desired transmission information 101 and a Gaussian distribution 102 via an input device outside the system 100. In some cases, the user-desired transmission information 101 and Gaussian distribution 102 may be stored into the memory 106 or the storage 104. The desired transmission information (101) and the standard Gaussian distribution (102) are fed to the encoder and decoder neural network modules 301, 301', 401 and 401' via an interface. The neural network modules 301, 301', 401, 401', 500 and 500' are pretrained, such that the system 100 can generate the corresponding hole vector pattern (107) of the device. The system 100 applies the mapping algorithm (1000), to draw/generate a layout of the actual device. Such network has been verified under a square based splitter model (1100) as one of embodiments of the present invention. Although the following embodiments of the present invention exemplary show the square based splitter model, it should be noted that the shape of the splitter (model) is not limited to a square. For instance, other shapes including rectangular, circular, oval, symmetry shapes, asymmetry shapes or an arbitrary shape that includes any of them may be used. In this case, such a splitter is configured to include an input port configured to receive an input beam having an input power, a power splitter including perturbation segments arranged in a first region and a second region of a guide material having a first refractive index, each segment having a second refractive index, wherein the first region is configured to split the input beam into a first beam and a second beam, wherein and the second region is configured to separately guide the first and second beams, wherein the first refractive index is greater than the second refractive index, and output ports including first and second output ports connected the power splitter to respectively receive and transmit the first and second beams.

Once the neural network modules are fully trained, the system can generate the splitter with any arbitrary splitting ratio the users want instantly. Some results using the system 100 indicate that those devices have the overall transmission at around 93% across a very broadband, which is really hard (in terms of time and efficiency) to get by using conventional methods such as Direct Binary Search (DBS). Comparing with another result obtained our another system that only includes the encoder network module-1 301, decoder network module-1 401 and the adversarial module-1 500 for training process, but does not include the encoder network module-2 301', decoder network module-2 401' adversarial module-2 501', the results according to the present invention show a significant improvement from our previous system.

Figure 2:
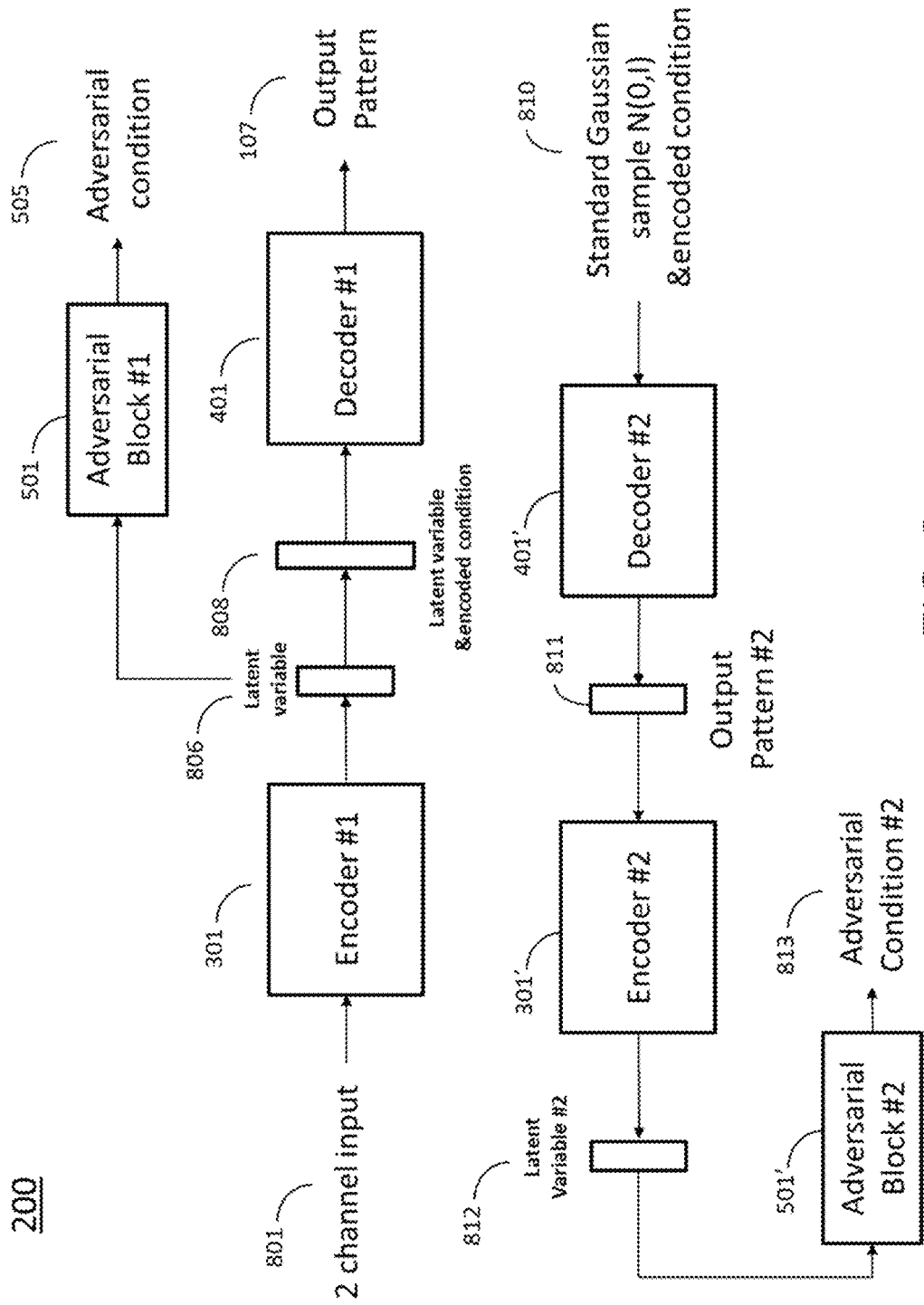
FIG. 2 shows the general adversarial CVAE network, according to embodiments of the present invention.

FIG. 2 shows the overall structure of the neural network model (device generating module) 200. The model 200 is constructed with six parts: two encoders (301, 301'), two decoders (401, 401') and two adversarial blocks (501, 501') (as shown in the FIG. 100). Encoder #1 and #2 (30) have the same structure and share the same weighs. Decoder #1 and #2 (401) have the same structure and share the same weights. Same standard applies to the adversarial blocks (501) as well. The encoder #1 (301) is configured to extract the input pattern features (801) and represent it using probability distribution which is defined as latent variable (806). The decoder #1 (401) has the similar structure to the encoder #1 (301) but in a reverse order. The decoder #1 is configured to generate the device pattern with the latent variable and the encoded condition (807). For the second decoder-encoder set: The decoder #2 (401') takes the standard Gaussian samples along with the encoded condition (801) to generate a second output patter (811) which will be used later in the loss function. The encoder #2 (301) then takes the second output pattern (811) to generate the second latent variable set (506). Output pattern #2 and Latent Variable #2 are only used for the training (to calculate the loss function). For the final model, we will use the trained decoder (401).

Figure 3:
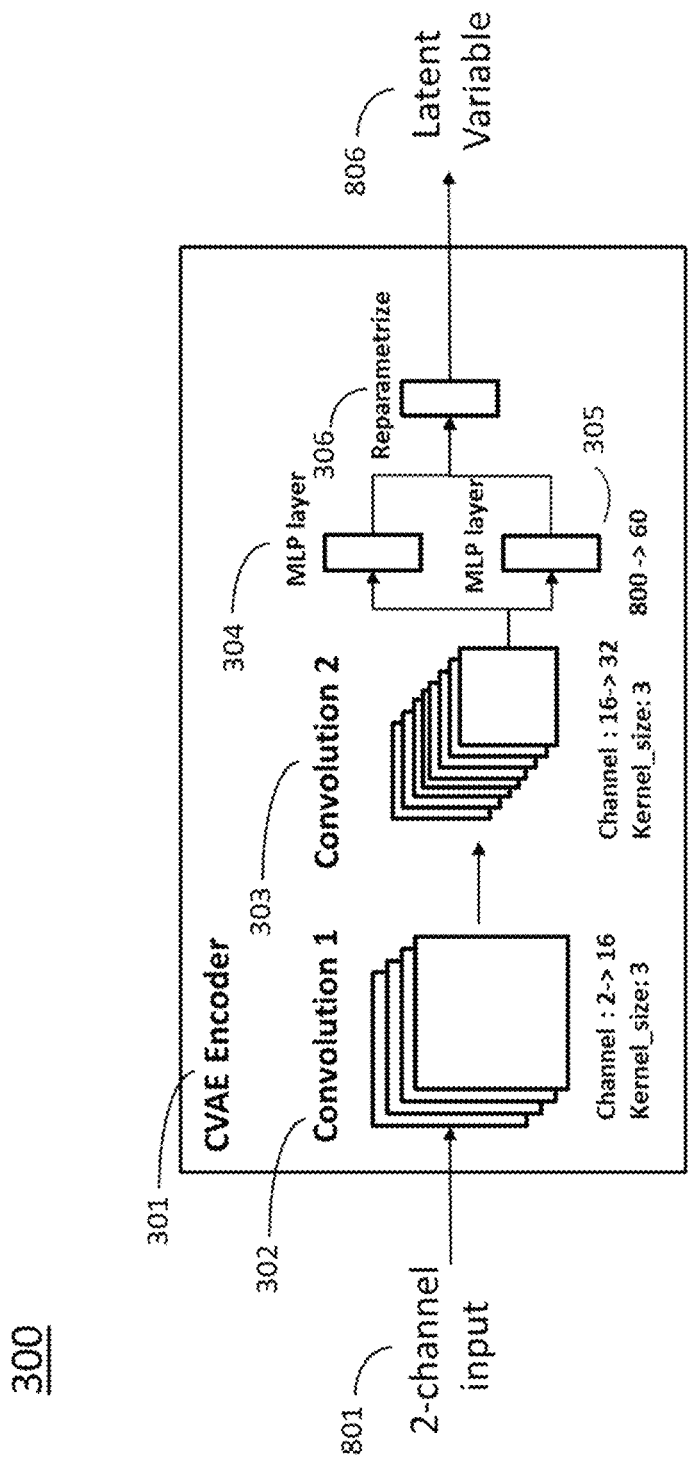
FIG. 3 shows the detailed structure of the CVAE encoder block, according to embodiments of the present invention.

FIG. 3 shows the detailed structure of the encoders 301, 301', in which the encoders 301 and 301' have an identical structure. The encoder 301 is constructed by two convolutional layers (303 & 304), (one has 8 channel the second one has 16 channel), followed by two parallel Multilayer Perceptron (MLP) layer (304 & 305). Each of the two parallel MLP layers may be parallel fully connected layers. In some cases, each of the two parallel MLP layers includes more than two inputs. For instance, the two parallel MLP layers are configured to have 800→60 input→output dimensions, to generate the extracted pattern (mean (μ) and covariance (σ) for the Gaussian distribution). In order to get the latent variable, the re-parametrization (306) of the mean and the covariance needs to be applied. The equation of the re-parameterization is shown below in Equation 1:

$$\text{Latent Variable} = \mu + \left(e^{\frac{\sigma}{2}} * N\right), \tag{1}$$

where the N is the random number which obey the standard Gaussian distribution (with mean of 0 and covariance of 1).

Figure 4:
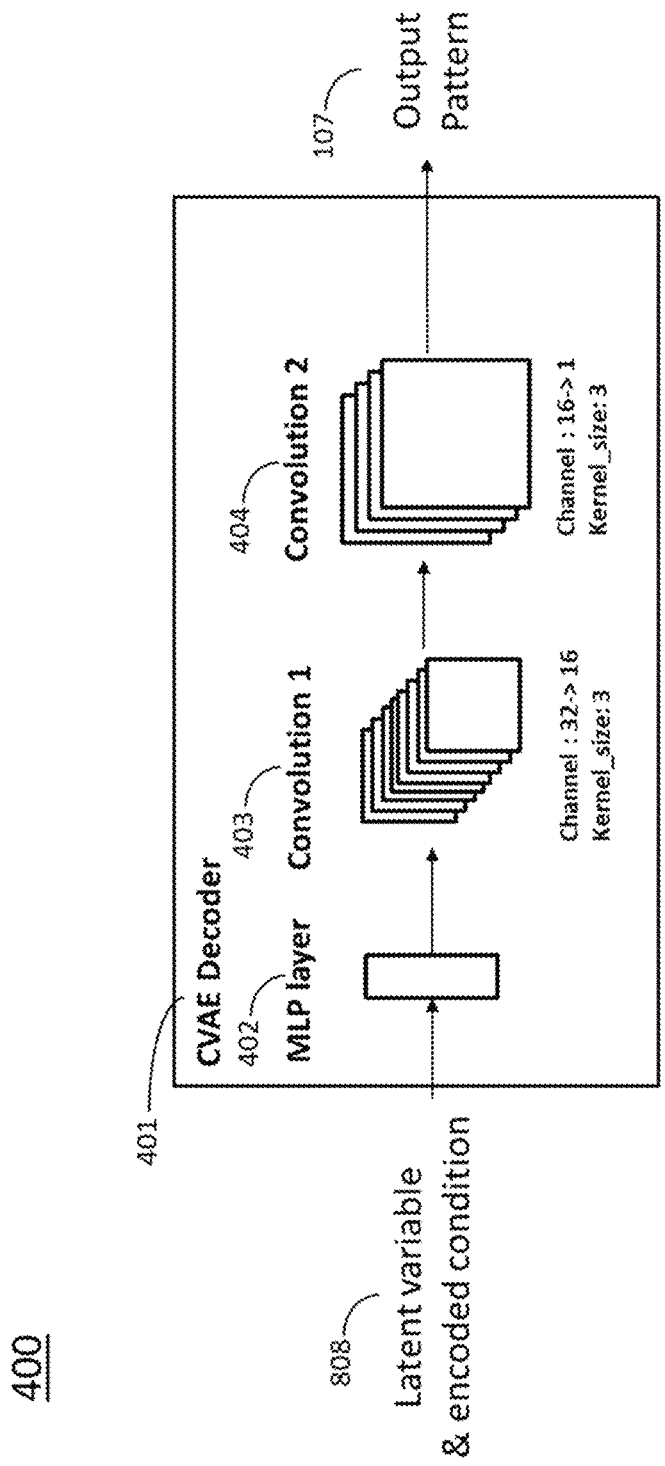
FIG. 4 shows the detailed structure of the CVAE decoder block, according to embodiments of the present invention.

FIG. 4 shows the detailed structure of the decoders 401 and 401', in which the decoders have an identical structure. The latent variable from the encoder (806) and the encoded condition data (807) are concatenated to form the input for the decoder (808). Then the combined data are fed into the decoder to generate the pattern. The decoder is combined with one Multilayer perceptron (MLP) layer (402) and two convolutional layers (403 & 404). The MLP layer has the input→output dimension of 69→800. In some cases, each of the two convolutional layers may be designed to have more than 2 channels. For instance, the two convolutional layers have the following specs: first one (403) has 8 channel the second one (404) has 16 channels. The output of second convolutional layer is the generated (or reconstructed) pattern (107). The final model used to generate different devices.

Figure 5:
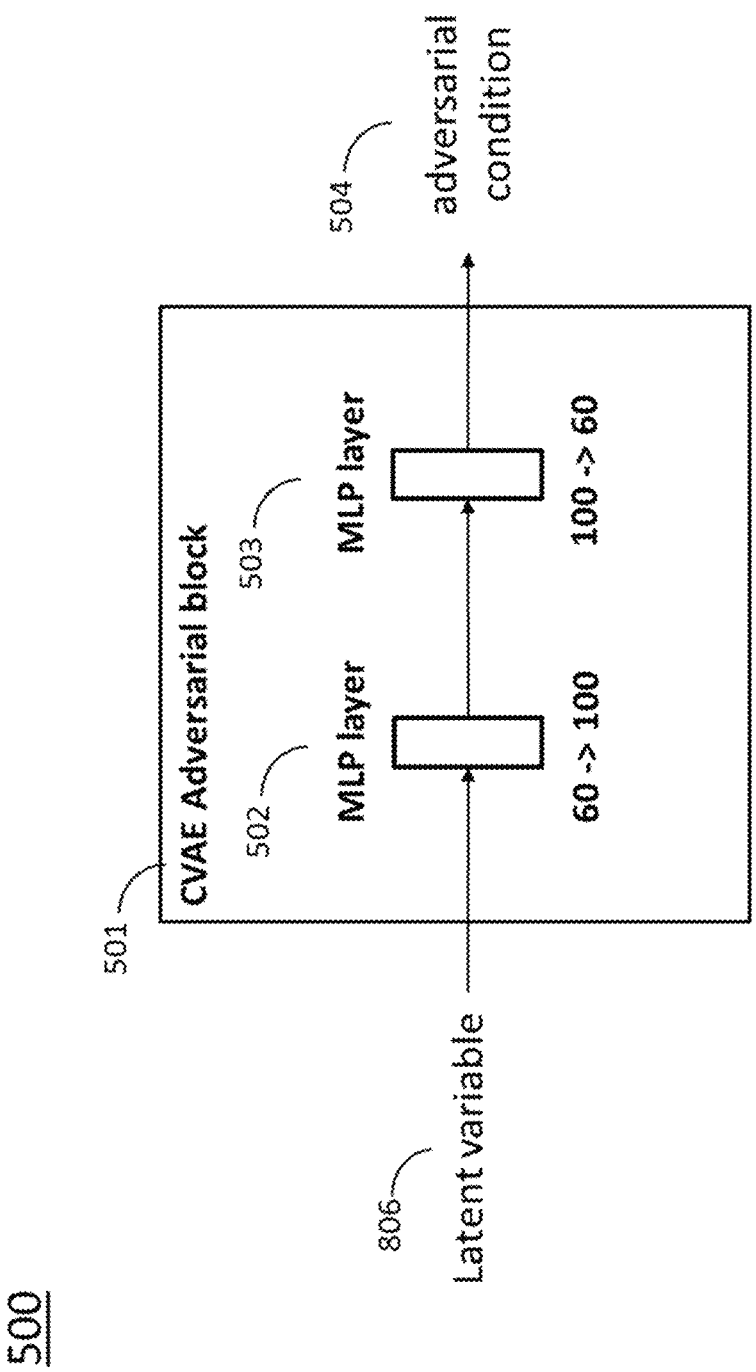
FIG. 5 shows the detailed structure of the adversarial block, according to embodiments of the present invention.

FIG. 5 shows the detailed structure of the adversarial blocks 501 and 501', in which the adversarial blocks have an identical structure. The adversarial block 501 has two MLP layers (502 & 503) (the first one has 60→100 input→output dimensions and the second one has 100→60 input→output dimension). The output of the adversarial block is the adversarial condition (504). We add the adversarial block to isolate the latent variable from the conditions in order to fit the device distribution better.

Figure 6:
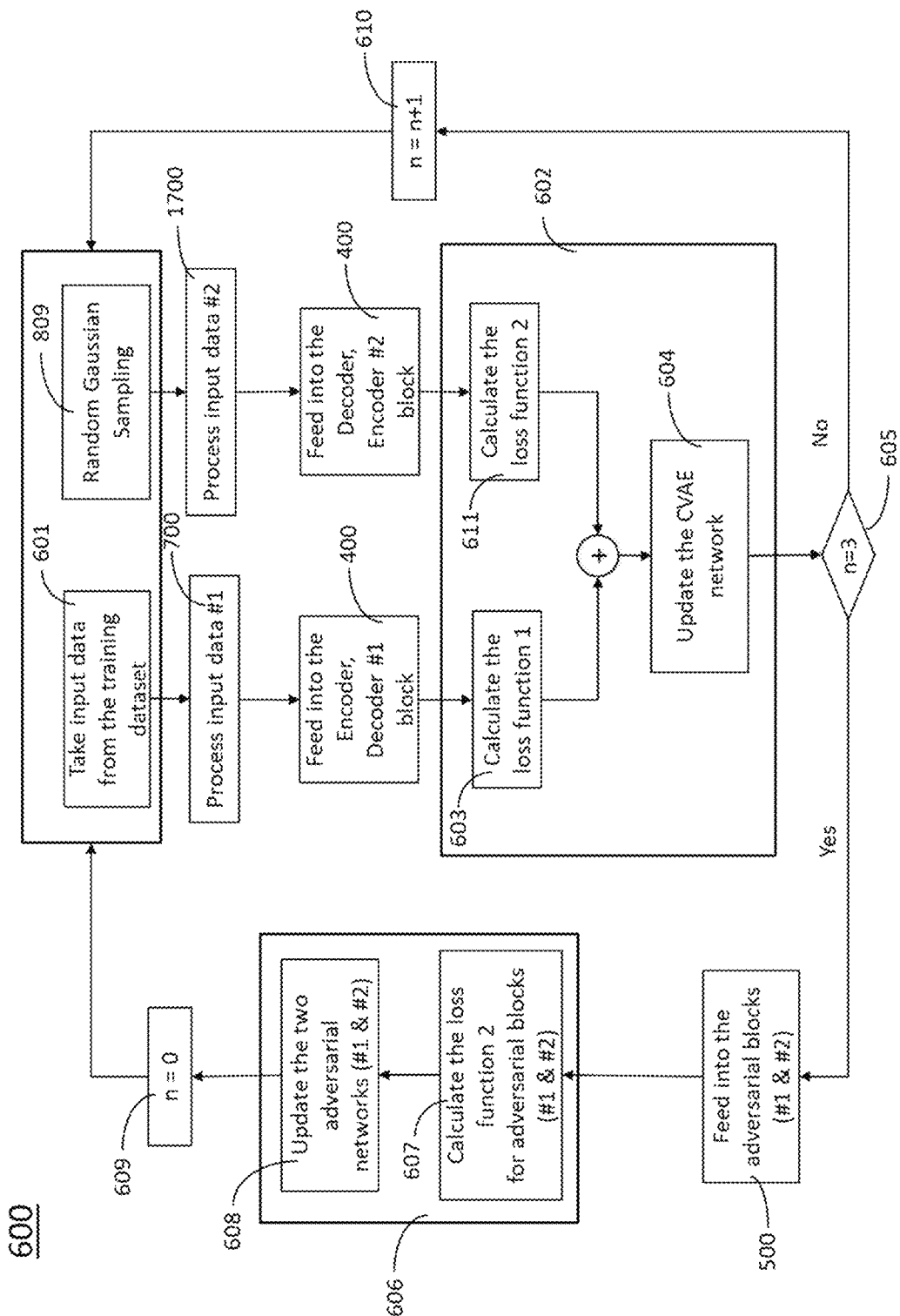
FIG. 6 shows the flowchart of the training process for the model, according to embodiments of the present invention.

FIG. 6 shows the detailed training process for the conditional Variational Autoencoder (CVAE) model 600 according to some embodiments of the present invention. First the data (input pattern and input condition) are taken from the dataset (601), then we process them into two channel input (301) and fed into the network. The process step is shown in 700. The complete training iteration include two part. Update the CVAE network (602) and update the adversarial block (606). The first loss function, Loss1 is calculated (603) after the process described above. In the meanwhile, the second loss function Loss 3 (Equation 4) is calculated after the second process: the random Gaussian sampling data (809) is later processed (1800) and then fed into the decoder encoder block (400) to get the second latent variable (506). The final loss will be the sum of the two loss functions (Loss1 and Loss3) and it will be used to update the encoder and decoder blocks (604). The second loss function (Loss 2) is calculated (607) after every three updates of the encoders and decoders. It is used to update the adversarial blocks only (608) (shown in Equation 3).

$$Loss1 = -[y_n \log x_n + (1-y_n)\log(1-x_n) + \qquad (2)$$
$$\frac{1}{2}\sum_{j=1}^{J}[1 + \log(\sigma_{zj}^2)^2 - \mu_{zj}^2 - \sigma_{zj}^2] - \beta \text{MSE\_LOSS}(s, \bar{s})$$

$$Loss2 = \text{MSE\_LOSS}(s, \bar{s}) + \text{MSE\_LOSS}(s, \bar{s}') \qquad (3)$$

$$Loss3 = \text{MSE\_LOSS}(z, \bar{z}) - \alpha \text{MSE\_LOSS}(s, \bar{s}') \qquad (4)$$

Where, $$\text{MSE\_LOSS}(x,y) = (x-y)^2$$

For Loss1, the first portion is the Binary cross entropy loss, the second part is the KL divergence loss and the third part is the Mean Square Error multiplied by a constant β to reach a training balance between the first adversarial block and the main model (encoder #1-decoder #1). For Loss3 (third loss function), the first term is the MSE loss between the normal gaussian sampling variable (809) and the second latent variable (506). The second term is the Mean Square Error multiplied by a constant α to reach a training balance between the second adversarial block and the main model (decoder #2-encoder #2). For Loss2, the loss function is the MSE loss between s and s̄, and that between s and s̄'. The network update in phase 1 is based on Loss1 and Loss3. By update the weight in the encoders and the decoders, we want to minimize Binary Cross Entropy Loss between the input (702) and the output pattern (107). We also want to minimize the MSE loss between the Standard Gaussian samples (809) and the latent variable #2 (812) In the meantime, the difference between the condition (701) and the two adversarial conditions (505) (506) needs to be maximized so that the encoder only extracted the pattern of the input pattern. The network update in Phase 2 is based on Loss2. In this phase, only the encoder blocks and the adversarial blocks are used and only the weight parameters in the adversarial blocks is updated (608). Here the loss is the MSE Loss between the between the condition (701) and the adversarial conditions (505), (506). By updating the adversarial blocks, we want to minimize the MES loss to form an adversarial relation between the two blocks. In order to achieve the balance between the two phases, Phase 1 updates three times while Phase 2 updates once. In order to do that, we introduce a variable n with initial value of 0. Every time the CVAE block is finished update (604), we check the n value (605). If n is smaller than 3, we add 1 to n and go back to step. If the n is 3, we feed data to update the adversarial blocks (606) and rest n to 0 (through 609). In other words, the first loss function may be expressed by combination of the binary crossentropy (BCE) Loss of between the input (801) and output (107) of the first encoder decoder set and the Kullback-Leibler Divergence (KL-Divergence) between the encoded latent (806) and the standard Gaussian Distribution and the encoded latent (806) and the output of the first adversarial block (505). Further, the second loss function may be expressed by combination of Mean Square Root Loss (Mean Squared Error Loss: MSE Loss) between the encoded latent (806) and the output from the first adversarial block (505) and the MSE loss between the condition between the encoded latent (812) and the output from the second adversarial block (813), and the third loss function may be expressed by combination of the MSE Loss between the standard gaussian samples (810) and the second latent variables (812) and the MSE loss between the encoded laten (812) and the output of the adversarial block (813).

Figure 7:
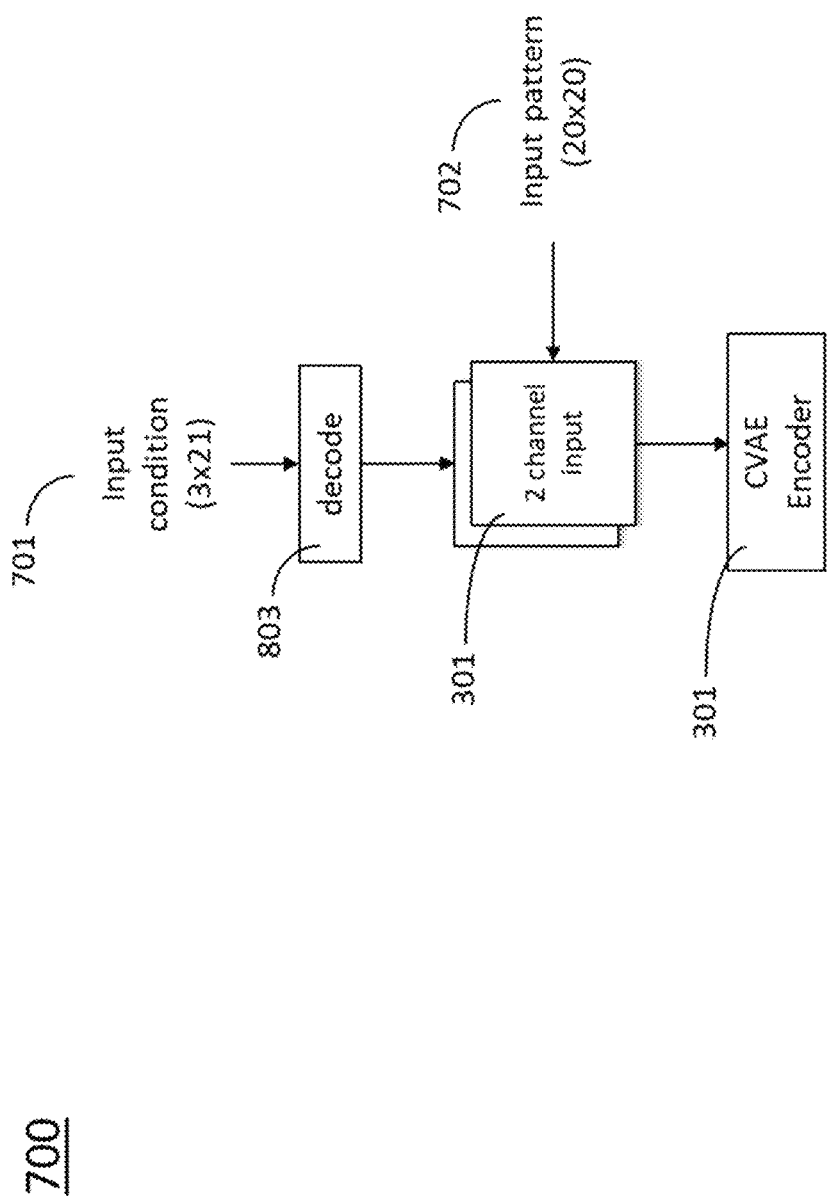
FIG. 7 shows the input data preprocess steps, according to embodiments of the present invention.

FIG. 7 shows the details to process the input data. The input data fed into the network (please express by a specific name of the network) (ACVAE with cycle consistency), are constructed by two channels (two 20×20 matrix) (801), the first one is the 20×20 input pattern (702) and the second is the decoded (3×20) input condition (701).

Figure 8:
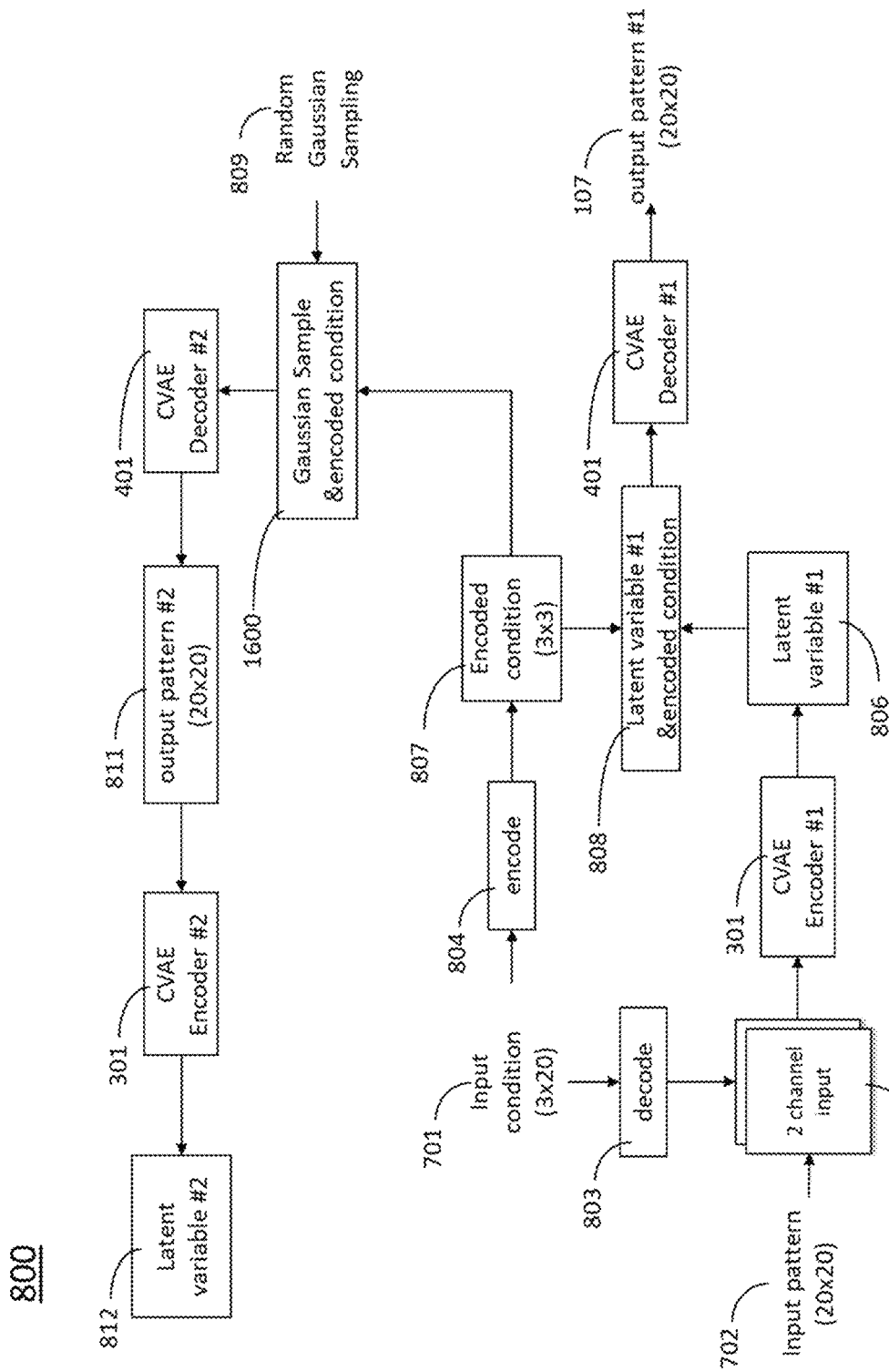
FIG. 8 shows the detailed data flow through the CVAE model, according to embodiments of the present invention.

FIG. 8 shows the dataflow 800 within the network according to some embodiments of the present invention. The input pattern data (702) and the input condition data (803) forms a 2-channel input into the CVAE encoder (301). The encoder #1 then generates the latent variable #1 with dimension of 60. Then the latent variable is concatenated with the encoded condition (807) (with dimension of 9) to form the input to the decoder #1 (808). After being processed by the decoder #1, the generated (or reconstructed) pattern #1 (107) is the output. In the meanwhile, the encoded condition is concatenated with Random gaussian sampling (809) through (1700) and is fed into decoder #2 to get the output pattern #2 (811). Then output pattern #2 will be the input of encoder #2 to get the latent variable #2.

Figure 9:
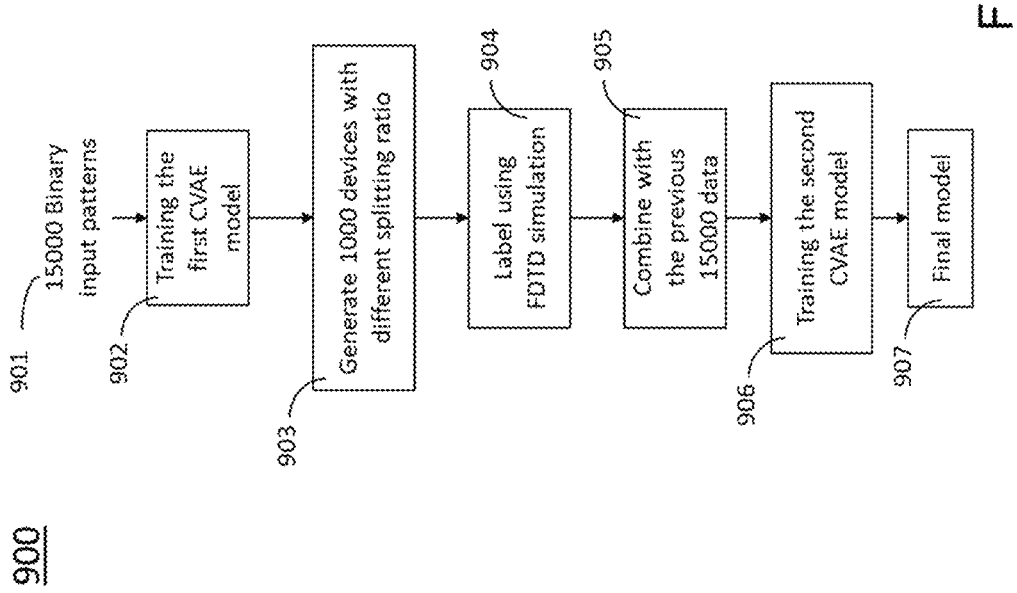
FIG. 9 shows the active learning process for generating the final model, according to embodiments of the present invention.

In order to fully train the Neural network model 200 (if number is wrong, please express by a specific name of the network) (ACVAE with cycle consistency). We used the concept of active learning. FIG. 9 shows the flowchart of that process. What we are doing is to train a preliminary use the original 15,000 binary training data. After finishing the first model. We use it to generate 1,000 devices with different holes sizes and label them with their spectrum at each port (condition) through the FDTD simulation. After that, we combine the new generated data along with the existing data to form a new 16,000 dataset and retrain the model. Then the second model is the final one that is used for the device generation.

Figure 10:
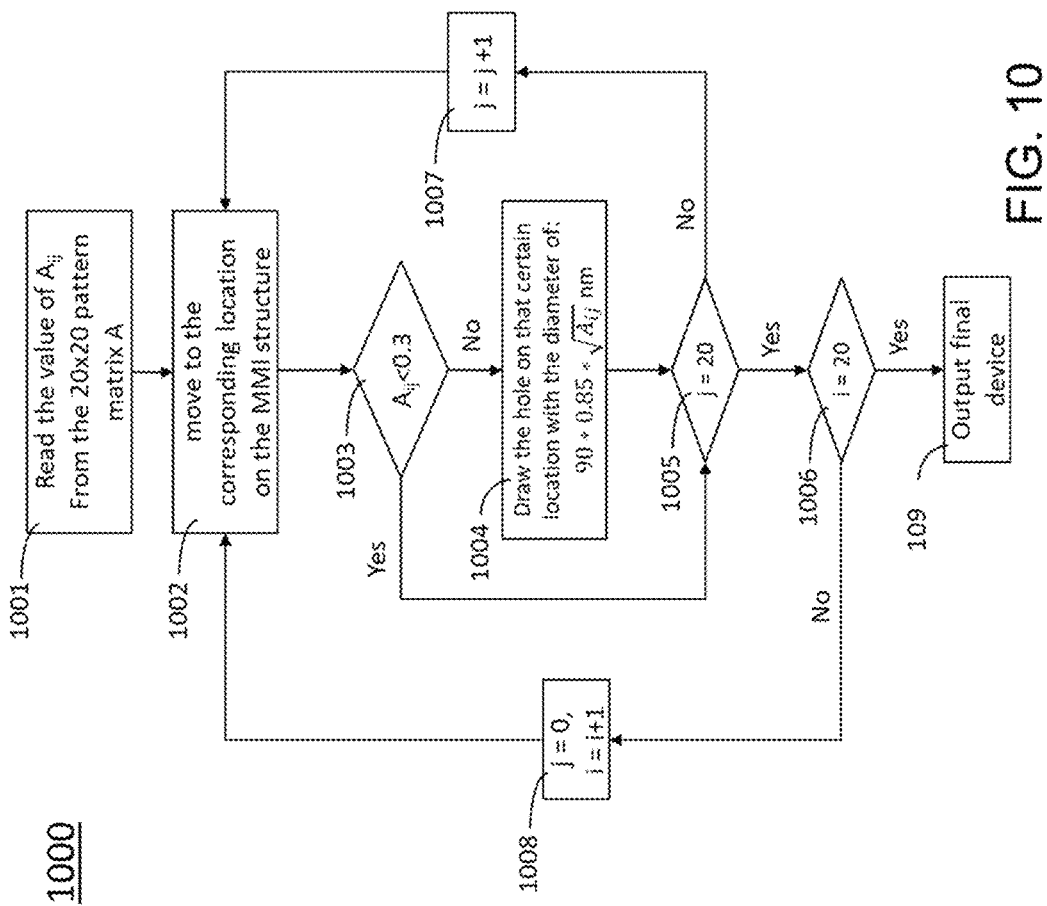
FIG. 10 shows the flowchart of the mapping algorithm of drawing the layout, according to embodiments of the present invention.

FIG. 10 shows a mapping algorithm 1,000 for drawing a layout of the actual device. The CVAE generated pattern (generated hole vector 107) is a 20×20 floating point matrix. Each point represents the Bernoulli distribution for each position point. So, the final generated patterns use the variable size instead of binary data to better represent the hole pattern and each floating number in the matrix will be treated as differential hole diameters. For instance, the maximum diameter of the hole may be 76.5 nm. For easier fabrication, a threshold 0.3 may be set to eliminate any holes that have the diameter below (90*0.85*√0.3 nm) in step (1004). Once the matrix is generated and retrieved (1001), the mapping algorithm 1000 is configured to create two indexes i and j to sweep through the entire matrix (starting from i=j=0). Then the algorithm 1000 goes to the element in the matrix $A_{ij}$ (1002) and check if the value is smaller than 0.3 (1003), if it is smaller, then no holes will be created. Otherwise, a hole with the diameter of: $90*0.85*\sqrt{A_{ij}}$ nm will be created on the layout of the device. We will first do the column sweeping (1005) then the row sweeping (1006) to finish the complete process. Once the sweep is done, the final layout will be the output (109).

Figure 11C:
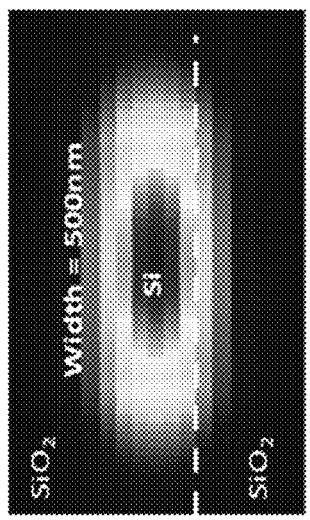
FIG. 11c mode profile at the device cross section, according to embodiments of the present invention.
Figure 11A:
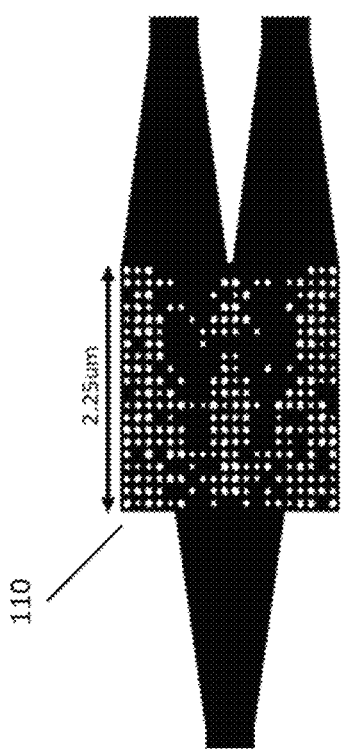
FIG. 11a overall device structure introduction, according to embodiments of the present invention.
Figure 11B:
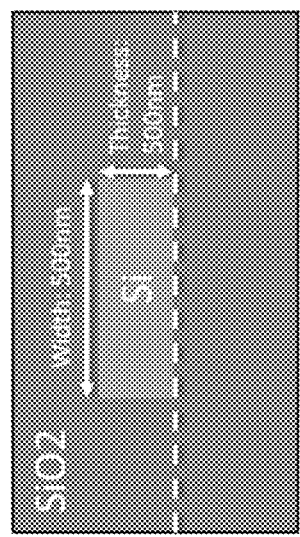
FIG. 11b overall device cross section structure, according to embodiments of the present invention.
Figure 14B:
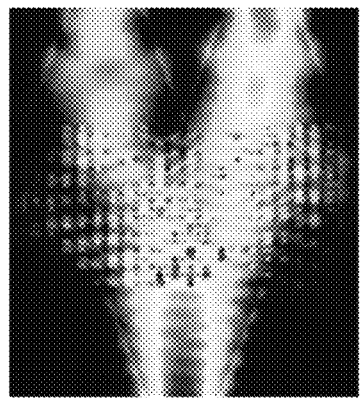
FIG. 14b shows the simulation result for the generated 7:3 splitter, according to embodiments of the present invention.
Figure 14D:
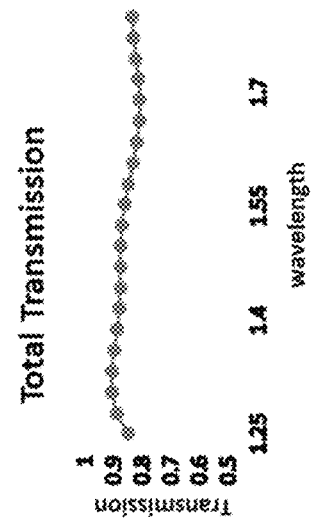
FIG. 14d shows the simulation result for the generated 5:5 splitter, according to embodiments of the present invention.
Figure 14A:
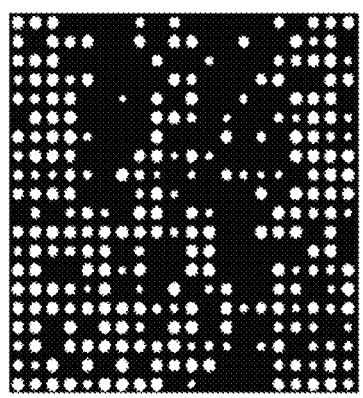
FIG. 14a shows the generated device with the splitting ratio of 7:3, according to embodiments of the present invention.
Figure 14C:
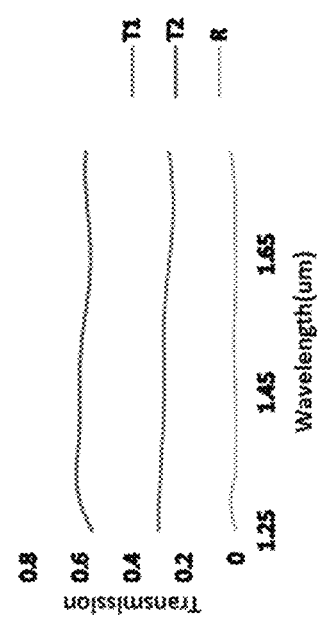
FIG. 14c shows the simulation result for the generated 5:5 splitter, according to embodiments of the present invention.

FIGS. 11a-11c shows an optical device 110 obtained by using the system 100 according to some embodiments of the present invention. The optical device 110 is a square based optical power splitter. The mechanism of splitting the power (of an optical beam) is to draw different holes and use the difference in the refractive index to guide the light propagation. The device 110 is designed for TE0 mode use. The square structure has footprint of 2.5 um×2.5 um with the oxide cladding. The waveguide has a width of 500 nm and the height of 220 nm. The hole spacing is 130 nm, and the minimum and maximum hole diameter are 76.5 nm, and 42 nm, respectively.

The power splitter 110 is formed of nanostructured segments that are arranged in the guide material to effectively guide the input optical beam along predesigned beam paths toward the output ports. In this case, the nanostructured segments are the nanostructured hole that have a refractive index being less than that of the guide material of the power splitter. The Waveguide of the power splitter 110 is Silicon and the material of the nanostructured hole is Silicon Dioxide ($SiO_2$).

FIG. 12*a*, FIG. 13*a*, FIG. 14*a* and FIG. 15*a* show schematics illustrating the power splitters with different splitting ratios (5:5, 6:4, 7:3, and 8:2) that are generated by the fully trained model. As shown in the figures, the splitters include an input port configured to receive an input beam having an input power, a power splitter including perturbation segments arranged in a first region and a second region of a guide material having a first refractive index, each segment having a second refractive index, wherein the first region is configured to split the input beam into a first beam and a second beam, wherein and the second region is configured to separately guide the first and second beams, wherein the first refractive index is greater than the second refractive index, and output ports including first and second output ports connected the power splitter to respectively receive and transmit the first and second beams.

FIG. 12*b*, FIG. 13*b*, FIG. 14*b* and FIG. 15*b* show the beam propagation through the devices. We consider the total power at port 1 and port 2 is 100%. The 5:5 splitter meaning port 1 holds 50% of the total output power and the port 2 holds 50% of the total output power. The 6:4 splitter meaning port 1 holds 60% of the total output power and the port 2 holds 40% of the total output power. The 7:3 splitter meaning port 1 holds 70% of the total output power and the port 2 holds 30% of the total output power. The 8:2 splitter meaning port 1 holds 80% of the total output power and the port 2 holds 20% of the total output power.

FIG. 12*c*-12*d*, FIG. 13*c*-13*d*, FIGS. 14*c*-14*d* and FIGS. 15*c*-15*d* show the spectrum response of those devices. The devices that are generated through our Adversarial Conditional Autoencoder have very good performance (with around 90% in total transmission) across the 550 nm bandwidth (from 1250 nm to 1800 nm).

Figure 16:
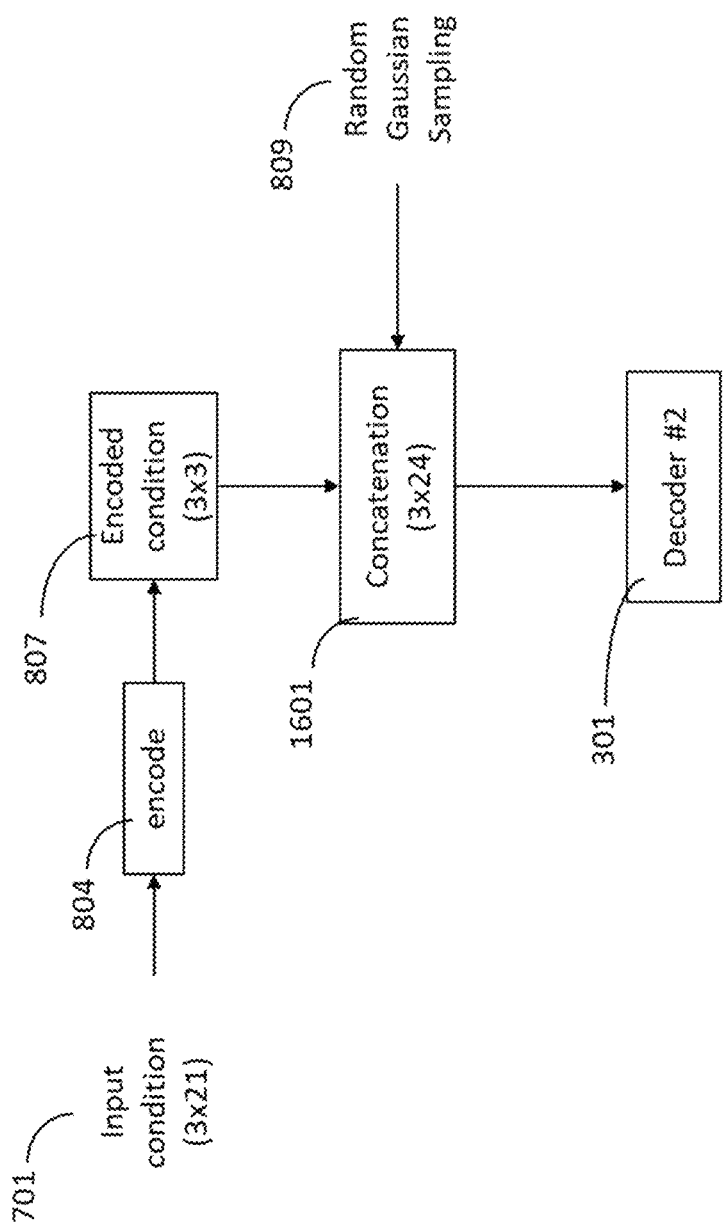
FIG. 16 shows the data process procedure before feeding into decoder #2, according to embodiments of the present invention.

FIG. 16 shows a computer-implemented method 1600 for designing a device according to some embodiments of the present invention. The method 1600 includes the data process procedure of the input condition 701 (input data/parameters) before feeding into decoder #2. The Random Gaussian sampling variables (809) is concatenated with the encoded condition (807) to form a 3×24 matrix (1601) and it will be fed into decoder #2 (301).

According to some embodiments of the present invention, there are the following advantages with respect to the device generated from the model. The devices can be manufactured in very compact sizes. For instance, the footprint can be only 2.25 um×2.25 μm or less, which is the smallest splitter according to our knowledge. With such compact size, it has the potential to be massively integrated in optical communication chips with relatively low area budget.

Figure 17:
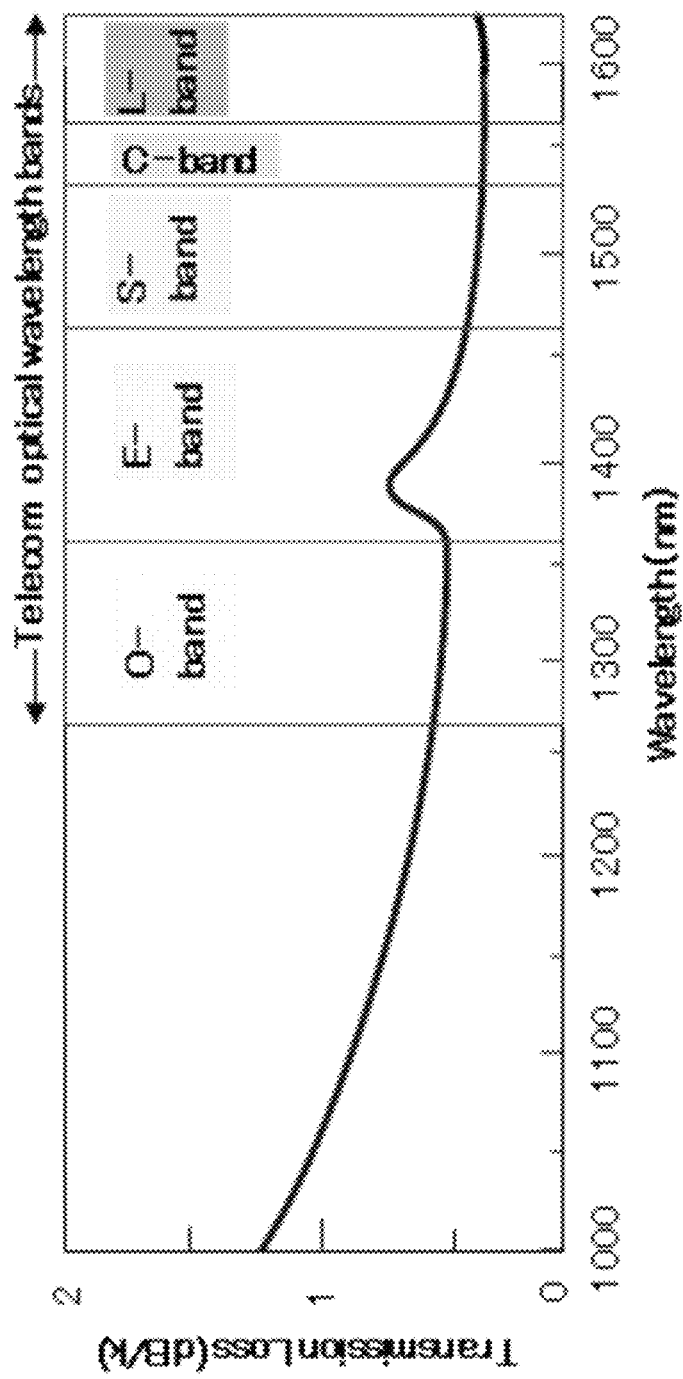
FIG. 17 shows the properties of transmission loss of optical fibers as a function of wavelengths.

The devices designed according to embodiments of the present invention can operate on an ultra-wide bandwidth (from 1250 nm to 1800 nm) while maintaining an excellent performance (around 90% transmission). Accordingly, the devices can cover all the optical communication band (From 0 band to L band corresponding to wavelengths ranging from 1260 nm to 1625 nm). See FIG. 17. The figure indicates the properties of transmission loss of optical fibers as a function of wavelengths.

The model has been proved to generate any devices that the user wants instantly without further optimization, which significantly saves the designing time.

Note that so far nanophotonic devices with periodic holes have been described as examples. However, there are other types of optical devices. For example, the adjoint method can optimize a greater number of parameters in general. This invention can use these types of devices as training data.

The invention claimed is:

1. A system for training a device design network for generating layouts of photonic devices, comprising:
   an interface configured to acquire input data of a photonic device, wherein the input data includes user-desired transmission information given as a condition, and a Gaussian distribution;
   a memory storing the device design network including a first encoder, a second encoder, a first decoder, a second decoder, and a first adversarial block and a second adversarial block, wherein the first and second encoders have a same structure and share same weights, the first and second decoders have a same structure and share same weights, and the first and second adversarial blocks have a same structure and share same weights; and
   a processor, in connection with the memory, configured to:
   train the device design network using training data including an input pattern, wherein the input pattern is a hole vector pattern, and an input condition, wherein the input condition is a transmission efficiency;
   update the weights of the first and second encoders and the first and second decoders based on a sum of a first loss function and a third loss function to reduce a difference between the input pattern and output pattern of the first and second decoders; and
   update the weights in the first and second adversarial blocks by minimizing a second loss function, wherein the second loss function maximizes a loss between the condition and the first and second adversarial conditions.

2. The system of claim 1, wherein the first and second encoders are constructed by at least one convolutional layer followed by at least one parallel fully connected layer to extract features of a layout of the photonic device.

3. The system of claim 2, wherein each of the at least one convolutional layer includes more than two channels.

4. The system of claim 2, wherein each of the at least one parallel fully connected layer includes two input/output dimensions.

5. The system of claim 1, wherein the photonic device is an optical power splitter, wherein the extracted device features are mean (μ) and covariance (σ) for the Gaussian distribution.

6. The system of claim 1, wherein the photonic device is a power splitter.

7. The system of claim 1, wherein the photonic device is a wavelength splitter.

8. The system of claim 1, wherein the photonic device is a mode converter.

9. The system of claim 1, wherein the training data comprises of device structures optimized by an adjoint method.

10. The system of claim 3, wherein the two convolutional layers include 8 channels and 16 channels, respectively.

11. The system of claim 4, wherein each of the two parallel fully connected layer include 800 input/output dimensions and 60 input/output dimensions, respectively.

12. A computer-implemented training method for training a device design network, wherein the method comprising steps of:
acquire input data of a photonic device via an interface, wherein the input data includes user-desired transmission information given as a condition, and a Gaussian distribution;
train the device design network using training data including an input pattern, wherein the input pattern is a hole vector pattern, and an input condition, wherein the input condition is a transmission efficiency;
update the weights of the first and second encoders and the first and second decoders based on a sum of a first loss function and a third loss function to reduce a difference between the input pattern and output pattern of the first encoder and the second encoder and the first decoder and the second decoders;
update the weights in a first adversarial block and a second adversarial block by minimizing a second loss function, wherein the second loss function maximizes a loss between the condition and the first and second adversarial conditions; and
store the device design network including a first encoder, a second encoder, a first decoder, a second decoder, and a first adversarial block and a second adversarial block, wherein the first and second encoders have a same structure and share same weights, the first and second decoders have a same structure and share same weights, and the first and second adversarial blocks have a same structure and share same weights.

13. The method of claim 12, wherein the first and second encoders are constructed by at least one convolutional layer followed by at least one parallel fully connected layer to extract features of a layout of the photonic device.

14. The method of claim 13, wherein each of the at least one convolutional layer includes more than two channels.

15. The method of claim 13, wherein each of the at least one parallel fully connected layer includes two input/output dimensions.

16. The method of claim 12, wherein the photonic device is an optical power splitter, wherein the extracted device features are mean ($\mu$) and covariance ($\sigma$) for the Gaussian distribution.

17. The method of claim 12, wherein the first loss function is expressed by combination of BCE Loss of between the input and output of the first encoder and decoder set and the KL-Divergence between the encoded latent, the standard Gaussian Distribution, the encoded latent and the output of the first adversarial block, wherein the second loss function is expressed by combination of Mean Square Root Loss (MSE Loss) between the encoded latent and the output from the first adversarial block and the MSE loss between the condition between the encoded latent and the output from the second adversarial block, wherein the third loss function is expressed by combination of the MSE Loss between the standard gaussian samples and the second latent variables, and the MSE loss between the encoded latent and the output of the adversarial block.

18. A computer-implemented method for generating layouts of photonic devices using a device generating network, comprising steps:
acquiring input data of the photonic device via an interface, wherein the input data includes user-desired transmission information given as a condition, and a Gaussian distribution;
feeding the input data into the device generating network, wherein the device generating network is pretrained by a computer-implemented training method of claim 12; and
generating layout data of a layout of the photonic device using the pretrained device generating network and storing the layout data into a memory.

19. The method of claim 18, wherein the photonic device is a mode converter.

20. The method of claim 18, wherein the training data comprises of device structures optimized by an adjoint method.

* * * * *